(12) United States Patent
Mortazavi et al.

(10) Patent No.: US 9,799,349 B2
(45) Date of Patent: Oct. 24, 2017

(54) ANALOG-TO-DIGITAL CONVERTER (ADC) DYNAMIC RANGE ENHANCEMENT FOR VOICE-ACTIVATED SYSTEMS

(71) Applicant: Cirrus Logic International Semiconductor Ltd., Edinburgh (GB)

(72) Inventors: Yousof Mortazavi, Austin, TX (US); Ramin Zanbaghi, Austin, TX (US); Aaron Brennan, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 14/696,172

(22) Filed: Apr. 24, 2015

(65) Prior Publication Data

US 2016/0314805 A1 Oct. 27, 2016

(51) Int. Cl.
| | |
|---|---|
| *G10L 25/78* | (2013.01) |
| *G10L 15/34* | (2013.01) |
| *G10L 21/034* | (2013.01) |
| *G10L 15/22* | (2006.01) |
| *H03M 1/18* | (2006.01) |
| *G10L 15/28* | (2013.01) |
| *H03M 3/00* | (2006.01) |

(52) U.S. Cl.
CPC .............. *G10L 25/78* (2013.01); *G10L 15/22* (2013.01); *G10L 15/28* (2013.01); *G10L 15/34* (2013.01); *G10L 21/034* (2013.01); *H03M 1/185* (2013.01); *H03M 3/49* (2013.01); *G10L 2015/223* (2013.01)

(58) Field of Classification Search
CPC ....... G10L 25/78; G10L 15/34; G10L 21/034; G10L 15/22; G10L 2015/223
See application file for complete search history.

(56) References Cited

U.S. PATENT DOCUMENTS

| | | | | |
|---|---|---|---|---|
| 5,915,234 | A | * | 6/1999 | Itoh .......................... G10L 19/12 704/219 |
| 6,353,404 | B1 | | 3/2002 | Kuroiwa |
| 6,359,939 | B1 | * | 3/2002 | Calderone ............. H04L 25/062 327/60 |
| 6,583,747 | B1 | * | 6/2003 | van der Goes .. H03K 17/04106 341/156 |
| 6,661,901 | B1 | | 12/2003 | Svean et al. |
| 8,717,211 | B2 | | 5/2014 | Miao et al. |
| 2009/0079611 | A1 | | 3/2009 | Hwang et al. |

(Continued)

FOREIGN PATENT DOCUMENTS

| | | |
|---|---|---|
| GB | 2501367 A | 10/2013 |
| GB | 2515526 A | 12/2014 |

*Primary Examiner* — Qian Yang

(74) *Attorney, Agent, or Firm* — Norton Rose Fulbright US LLP

(57) ABSTRACT

The dynamic range and power efficiency of a voice-activated system may be improved by dynamically adjusting the configuration of the voice-activated system's input path. In one embodiment, a first portion of audio may be received through an input path of the voice-activated system having a first configuration. A characteristic of the first portion of audio may be determined and the input path may be adjusted to a second configuration based on the determined characteristic. A second portion of audio may then be received through the input path having the second configuration, and speech analysis may be performed on the second portion of audio.

33 Claims, 5 Drawing Sheets

(56) References Cited

U.S. PATENT DOCUMENTS

| | | | |
|---|---|---|---|
| 2009/0204410 A1* | 8/2009 | Mozer | G10L 15/30 704/275 |
| 2009/0287489 A1* | 11/2009 | Savant | G10L 15/07 704/246 |
| 2010/0292987 A1 | 11/2010 | Kawaguchi et al. | |
| 2011/0125494 A1* | 5/2011 | Alves | G10L 21/0208 704/226 |
| 2011/0137649 A1 | 6/2011 | Rasmussen et al. | |
| 2014/0336948 A1* | 11/2014 | Qin | A61B 5/7217 702/19 |
| 2015/0340040 A1* | 11/2015 | Mun | G10L 17/22 704/246 |
| 2016/0019891 A1* | 1/2016 | Martinez | G10L 15/22 704/275 |
| 2016/0019905 A1* | 1/2016 | Stylianou | G10L 21/0364 704/226 |

* cited by examiner

ANALOG-TO-DIGITAL CONVERTER (ADC) DYNAMIC RANGE ENHANCEMENT FOR VOICE-ACTIVATED SYSTEMS

FIELD OF THE DISCLOSURE

The instant disclosure relates to analog-to-digital converters (ADCs). More specifically, portions of this disclosure relate to dynamic range (DR) enhancement of ADCs in voice-activated systems.

BACKGROUND

In conventional voice-activated systems, audio samples are monitored and processed to detect the presence of human voice activity. After human voice activity is detected, the audio samples of the human voice are further processed via speech-processing techniques. Typically, the utterance of a particular word or phrase triggers the transition of the system from monitoring for human voice activity to performing speech processing. For example, a human may utter the following: "Blue Genie, what is the temperature?" In this example, "Blue Genie" is the "trigger," and the remainder is the "command." Therefore, a conventional voice-activated system will monitor audio samples to detect the trigger phrase "Blue Genie." Any word uttered by the human voice after the trigger phrase is detected is subsequently speech-processed by the voice-activated system.

One conventional implementation uses a single high-performance ADC to process all speech, including the trigger and the command. However, this implementation has numerous drawbacks. For example, designing and operating the ADC to meet the high signal-to-noise ratio (SNR) requirements at all times results in high power consumption and thus shortened battery life. In a device such as a mobile phone, voice-activated control is often not a primary means of controlling an electronic system. Thus, power consumed monitoring for uttered words provides limited benefit to the user of the mobile device.

Shortcomings mentioned here are only representative and are included simply to highlight that a need exists for improved electrical components, particularly for ADCs and speech detection in voice-activated systems employed in consumer-level devices, such as mobile phones. Embodiments described herein address certain shortcomings but not necessarily each and every one described here or known in the art.

SUMMARY

A reconfigurable input path for receiving audio signals, such as voice commands, may provide lower power consumption and similar performance in processing the audio signals. For example, low power DR enhancement of ADCs in voice-activated systems may be achieved by dynamically adjusting the operational performance of components of the voice-activated system based on analysis of received audio samples. For example, while the voice-activated system is monitoring audio samples for human voice activity, the ADC within the voice-activated system may be operated in a low-power state. After the trigger has been detected, if the audio signal quality is not sufficient for performing speech-processing on the audio samples, then the ADC may be adjusted to operate in a higher-performance state. For example, if the SNR of the audio samples is too low to meet the required SNR for speech processing, the ADC may be reconfigured after speech is detected. Power efficiency may be increased and DR may be improved when the ADC is operated in the high-performance state only when the audio samples require speech-processing, but not while audio samples are only being monitored for human voice activity.

The power efficiency may improve because for a significant amount of time the input path may operate in a low power (e.g., low DR) mode of operation. Electronic devices that provide voice-activation are more frequently monitoring audio samples to detect human voice activity than performing speech processing on uttered words. Without a reconfigurable input path, the ADC would be operating at high SNR during this entire time, causing the voice-activated system to consume more power than necessary monitoring for a command. This result is especially undesirable when the voice-activated system is implemented in a mobile device because unnecessary power consumption reduces the battery life of the mobile device and requires more frequent charging of the battery, both of which reduce user satisfaction with the mobile device. One solution to provide lower power consumption is to reduce the SNR or otherwise reduce audio processing power at the ADC while monitoring for a trigger.

Audio samples monitored prior to the detection of a trigger can be processed without high-performance speech processing software routines. Thus, the performance requirements for components within a voice-activated system are different when the audio samples are to be processed to detect human voice activity than when the audio samples are to be processed via speech processing techniques. For example, the minimum signal-to-noise ratio (SNR) requirement for an ADC within a voice-activated system may be lower when the audio samples are to be processed to detect human voice activity than when the audio samples are to be processed via speech processing techniques. However, because conventional voice-activated systems process all audio samples with a single ADC, the ADC is designed and operated to meet the highest SNR requirements at all times.

According to one embodiment, a method for low power DR enhancement of ADCs in voice-activated systems may include receiving a first portion of audio through an input path having a first configuration; determining a characteristic of the first portion of audio; adjusting the input path to a second configuration based, at least in part, on the determined characteristic; receiving a second portion of audio through the input path having the second configuration; and/or performing speech analysis on the second portion of audio. In some embodiments, the step of performing speech analysis comprises performing speech analysis with a digital signal processor (DSP).

In certain embodiments, the first portion of audio comprises a trigger command, and the second portion of audio comprises an instruction command. In addition, in some embodiments, the step of determining the characteristic comprises determining at least one of a SNR, a signal level, and a frequency content.

In some embodiments, adjusting the input path comprises adjusting at least one of a gain, a SNR, and a dynamic range of the input path. In particular, according to one embodiment, adjusting the input path comprises adjusting a gain for an amplifier of the input path from a first value of the first configuration to a higher second value of the second configuration. In some embodiments, adjusting the gain comprises adjusting the gain based, at least in part, on a signal level of the first portion of audio to obtain a desired SNR in the input path for performing speech analysis on the second portion of audio, which in some embodiments may comprise an instruction command.

In other embodiments, adjusting the input path may comprise adjusting a noise floor for an ADC of the input path from a first value part of the first configuration to a lower second value part of the second configuration. For example, according to one embodiment, adjusting the noise floor may include at least one of: adjusting a value of a resistor in the ADC, adjusting a value of a capacitor in the ADC, and adjusting a value of current flowing in the ADC.

According to another embodiment, adjusting the input path may also comprise de-activating a first ADC of the input path and activating a second ADC of the input path. In some embodiments, the first ADC may be a low-power, low dynamic range (DR) ADC with minimal signal amplification in its gain stage, and the second ADC may be a high-power, high DR ADC with more signal amplification in its gain stage than the first ADC. Although power is referenced for the first and second ADC, the first and second ADC may have similar amplification capabilities. A low-power first ADC, as compared with a higher-power second ADC, may be obtained by decreasing dynamic range.

In certain embodiments, the method may also include adjusting a gain of the input path to a third configuration based, at least in part, on a characteristic of the received second portion of audio; receiving a third portion of audio through the input path having the third configuration; performing speech analysis on the third portion of audio; and/or continuing to adjust the gain of the input path for additional portions of audio.

According to another embodiment, an apparatus may include a microphone; an input path coupled to receive audio signals from the microphone, wherein the input path comprises an ADC; and/or a DSP coupled to the input path to receive a digital representation of the audio signals, wherein the DSP is configured to: receive a first portion of audio through the input path having a first configuration; determine a characteristic of the first portion of audio; adjust the input path to a second configuration based, at least in part, on the determined characteristic; and/or receive a second portion of audio through the input path having the second configuration. In some embodiments, the DSP is further configured to perform the step of performing speech analysis on the second portion of audio.

In some embodiments, the input path further comprises an amplifier coupled between the microphone and the ADC, and wherein the step of adjusting the input path comprises adjusting a gain for an amplifier of the input path from a first value of the first configuration to a higher second value of the second configuration. In one embodiment, the step of adjusting the gain comprises adjusting the gain based, at least in part, on a signal level of the first portion of audio to obtain a desired SNR in the input path for performing speech analysis on the second portion of audio.

According to an embodiment, the step of adjusting the input path comprises adjusting a noise floor of the ADC of the input path from a first value for the first configuration to a lower second value for the second configuration. In one embodiment, the step of adjusting the noise floor comprises at least one of: adjusting a value of a resistor in the ADC; adjusting a value of a capacitor in the ADC; and adjusting a value of current flowing in the ADC.

According to an embodiment, the input path further comprises a second ADC, and wherein the DSP is configured to perform the step of adjusting the input path by: de-activating a first ADC of the input path; and activating a second ADC of the input path. In one embodiment, the first ADC comprises a low-power, low dynamic range ADC, and wherein the second ADC comprises a high-power, high dynamic range ADC.

In certain embodiments, the DSP is further configured to: adjust a gain of the input path to a third configuration based, at least in part, on the received second portion of audio; receive a third portion of audio through the input path having the third configuration; perform speech analysis on the third portion of audio; and/or continue to adjust the gain of the input path for additional portions of audio.

According to another embodiment, a mobile device may include a microphone; and audio processing circuitry coupled to the microphone and configured to receive audio signals from the microphone. In some embodiments, the audio processing circuitry comprises an analog-to-digital converter (ADC); and/or a digital signal processor (DSP) coupled to the ADC to receive a digital representation of the audio signals, wherein the audio processing circuitry is configured to: receive a first portion of audio from the microphone while the audio processing circuitry is configured in a first configuration; determine a characteristic of the first portion of audio; adjust the audio processing circuitry to a second configuration based, at least in part, on the determined characteristic; and/or receive a second portion of audio through the microphone while the audio processing circuitry is configured in the second configuration.

In some embodiments, the audio processing circuitry further comprises an amplifier coupled between the microphone and the ADC, and wherein the step of adjusting the input path comprises adjusting a gain for an amplifier of the input path from a first value of the first configuration to a higher second value of the second configuration. In one embodiment, the step of adjusting the gain comprises adjusting the gain based, at least in part, on a signal level of the first portion of audio to obtain a desired SNR in the input path for performing speech analysis on the second portion of audio.

In another embodiment, the step of adjusting the input path comprises adjusting a noise floor for the ADC of the input path from a first value for the first configuration to a lower second value for the second configuration. For example, in one embodiment, the audio processing circuitry may comprise at least one of a variable resistor and a variable capacitor, wherein the audio processing circuitry is configured to adjust the noise floor by performing at least one of the steps of: adjusting a value of a resistor in the ADC; adjusting a value of a capacitor in the ADC; and adjusting a value of current flowing in the ADC.

In some embodiments, the input path further comprises a second ADC, and the DSP is configured to perform the step of adjusting the input path by: de-activating the analog-to-digital converter (ADC) of the input path; and activating a second analog-to-digital converter (ADC) of the input path. In one embodiment, the ADC comprises a low-power, low dynamic range ADC, and the second ADC comprises a high-power, high dynamic range ADC.

In certain embodiments, the audio processing circuitry is further configured to perform the steps of: adjusting the gain of the amplifier to a third configuration based, at least in part, on the received second portion of audio; receiving a third portion of audio while the gain is set to the third configuration; performing speech analysis on the third portion of audio; and continuing to adjust the gain of the amplifier for additional portions of audio.

In some embodiments, the audio processing circuitry is further configured to perform the step of performing speech analysis on the second portion of audio. In addition, in one embodiment, the DSP comprises a portion of a general purpose central processing unit (CPU) of the mobile device.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
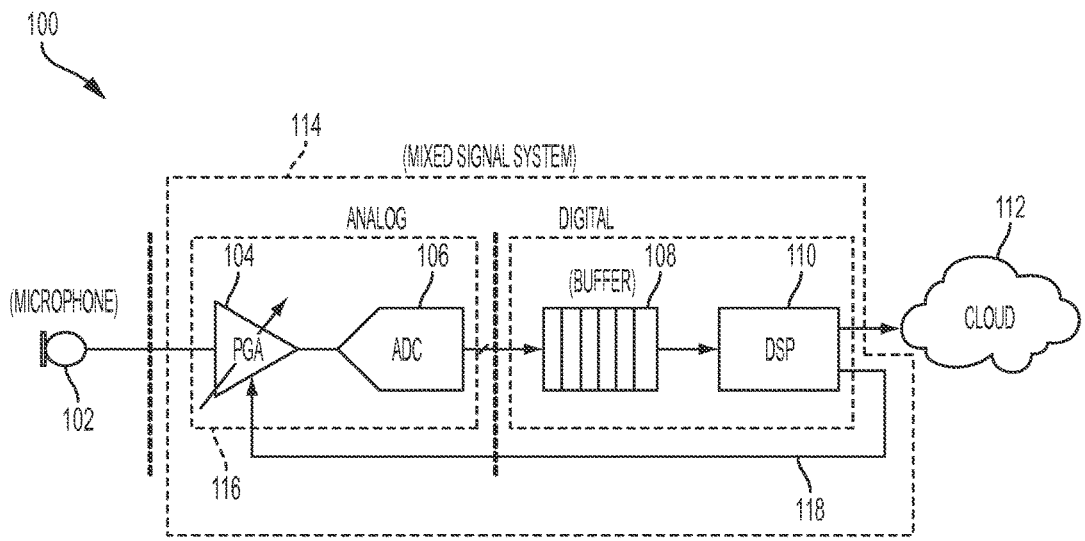
FIG. 1 is an example schematic block diagram illustrating a voice-activated system with a DR-enhanced ADC according to one embodiment of the disclosure.

One embodiment of a voice-activated system with a dynamic range (DR)-enhanced low-power analog-to-digital converter (ADC) is illustrated in the schematic block diagram of FIG. 1. The electronic system 100 may include a microphone 102, a programmable gain amplifier (PGA) 104, an ADC 106, a buffer 108, a digital signal processor (DSP) 110, and a computing network 112. Analog components 104 and 106 and digital components 108 and 110 may be integrated in a mixed signal system 114, such as a voice-activated system. In some embodiments, the microphone 102 may be part of the voice-activated system 114, while in other embodiments the microphone 102 may be external to the voice-activated system 114. The computing network 112 may be a "cloud" of networked computers and data centers. In some embodiments, the computing network 112 may be accessed by mixed signal system 114 for data storage, such as for storing the text converted from speech. In other embodiments, the computing network 112 may be accessed by electronic system 100 for processing portions of the speech, such that the electronic system 100 transmits recorded audio to the computing network 112 and receives back the transcribed text. Although FIG. 1 illustrates the PGA 104 and ADC 106 as two separate components, in some embodiments, the PGA 104 and ADC 106 may be designed and operated as a single component 116. When integrated, the single component that includes the PGA 104 and ADC 106 may still be referred to as an ADC.

When the voice-activated system 114 is idle, such as when the voice-activated system 114 is not performing speech processing, the voice-activated system 114 may operate in a voice activity detect mode in which it continuously processes audio samples to detect human voice activity. For example, audio signals detected by the microphone 102 may be transferred to the PGA 104 and the low-power ADC 106 to convert the analog audio signal to a digital audio signal. The microphone 102, PGA 104, and ADC 106 may be ON at nearly all times to reduce response time between the time instant when a user issues a voice command and the time instant when the commanded action is performed. The voice activity detect mode may be a low power mode of the voice-activated system 114. The low power consumption may be enabled by a low minimum signal quality for the software routines executed by the DSP 110 while the voice-activated system 114 is in the voice activity detect mode. For example, the DSP 110 may have lowered SNR requirements for audio samples in voice activity detect mode.

The digital audio samples output by the ADC 106 may be stored in the buffer 108, which may be a first-in-first-out (FIFO) buffer. The DSP 110 may poll the buffer 108 for new samples and process the samples to determine if human voice activity is present. When voice activity is detected, the voice-activated system 114 may transition to a voice wake mode (also referred to as a "trigger detect mode") in which the DSP 110 processes audio samples to detect a trigger sound, word, phrase, and/or sentence. More complicated DSP routines may be used to process audio samples during the voice wake mode than in the voice activity detect mode. These more complicated routines may be necessary to detect an uttered trigger. The more advanced routines may require better signal quality, such as higher SNR, which results in larger power consumption by the ADC 106.

After the trigger is detected, the voice-activated system 114 may operate in a speech processing mode (also referred to as a "command processing mode"), in which the DSP 110 processes the audio samples with speech processing software algorithms to decipher the information spoken by the human voice. This deciphered information may be used to initiate further processing by the electronic system 100, such as to cause an action to be performed by the electronic system 100. For example, in some embodiments, the DSP 110 may convert the detected speech to text and transfer the text to the computing network 112. This text may be displayed on a screen or inserted into a document. Alternatively, the text may cause the electronic system 100 to execute an action.

Figure 2:
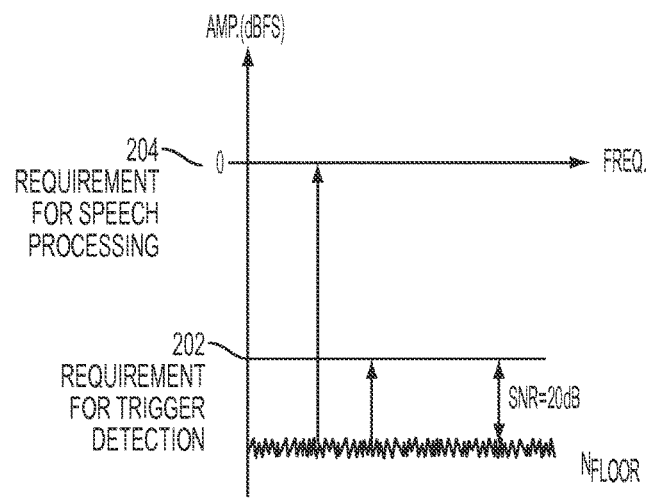
FIG. 2 is an example amplitude-versus-frequency plot illustration of the distinction between the audio signal quality requirements for detecting a trigger and for performing speech processing according to one embodiment of the disclosure.

The signal quality of the audio samples required by the DSP 110 to detect the trigger may be different than the signal quality of the audio samples required by the DSP 110 to execute speech processing routines. For example, FIG. 2 is an example amplitude-versus-frequency plot illustration of the distinction between the audio signal quality requirements for detecting a trigger and for performing speech processing according to one embodiment of the disclosure. An audio signal that reaches level 202 yields an SNR of 20 dB and may be sufficient to meet the SNR requirement imposed by a DSP to detect a trigger. However, a stronger audio signal that reaches level 204 with a higher SNR may be necessary to meet the SNR requirement imposed by the DSP for performing speech processing routines on the audio samples. In some embodiments, the SNR requirement for performing speech processing may be as low as 30 dB and as high as 40 dB, although the actual requirement may vary outside this range for different embodiments.

To account for the wide SNR requirement range, the voice-activated system 100 may include a feedback path 118 from the DSP 110 to the PGA 104 to adjust the gain of the PGA 104 to meet different SNR requirements using a single ADC 106. For example, in some embodiments, the DSP 110 may receive a first portion of audio, such as a trigger command, from an input path of the PGA 104 and ADC 106 having a first configuration. For example, the PGA 104 may be set to a first gain value. In another example, the input path having a first configuration may include the ADC 106 of the input path being configured with a first noise floor value. To aid in providing signals to the feedback path 118, the DSP 110 may be configured to determine a characteristic of the first portion of audio. For example, the DSP 110 may be configured to determine at least one of a SNR, a signal level, and a frequency content of the audio samples in the first portion of audio.

The DSP 110 may be configured to adjust the input path to a second configuration based, at least in part, on the determined characteristic. For example, the DSP 110 may adjust the gain of the PGA 104 from a first gain value part to a higher second gain value. In other words, the DSP 110 may adjust the gain of the PGA 104 or other amplifying components based, at least in part, on a signal level of the first portion of audio to obtain a desired SNR in the input path for performing speech analysis on a second portion of audio. In other embodiments, the DSP 110 may adjust the input path to a second configuration by adjusting a noise floor of the ADC 106 from a first noise floor value to a lower second noise floor value to achieve a similar result.

Figure 3:
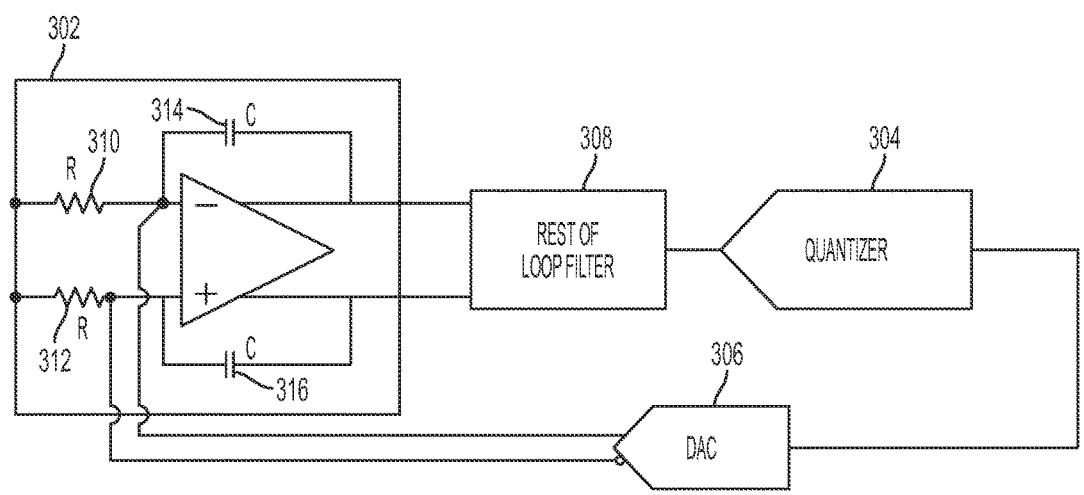
FIG. 3 is an example schematic block diagram illustrating an adjustable continuous-time delta-sigma modulation ADC according to one embodiment of the disclosure.

To illustrate an example of adjusting the input path according to one embodiment of the disclosure, FIG. 3 provides an example schematic block diagram illustrating a continuous-time delta-sigma modulation ADC (ΔΣ ADC). The ΔΣ ADC 300 may include an integrator 302, a quantizer 304, and a digital-to-analog converter (DAC) 306. In some embodiments, the ΔΣ ADC 300 may also include additional loop filtering components (or rest of loop filter) 308.

In some embodiments, the ΔΣ ADC 300 may correspond to a circuit implementation that includes the PGA 104 and ADC 106. In other words, the ΔΣ ADC 300 may correspond to a single-component ADC embodiment of an input path that includes an amplifying portion and an ADC portion. Adjusting the input path in this embodiment may include adjusting the value of one or more resistors in the ADC, such as resistors 310 and 312 in the integrator 302. For example, to reduce the noise floor value of the ΔΣ ADC 300, the resistance values of the resistors 310 and 312 may be reduced. Alternatively, the resistance value of the resistors 310 and 312 may be increased to increase the noise floor value of the ΔΣ ADC 300. Because the resistors 310 and 312 may need to be adjustable in some embodiments, the resistors 310 and 312 may be variable resistors (varistors). Alternatively, the resistors 310 and 312 may be switched resistor elements making up a larger programmable (variable) resistance device substituted for resistors 310 and/or 312. In another embodiment, adjusting the input path from the first configuration to the second configuration may include adjusting the value of one or more capacitors in the ADC, such as capacitors 314 and 316 in the integrator 302. For example, to reduce the noise floor value of the ΔΣ ADC 300, the capacitance values of the capacitors 314 and 316 may be increased. Alternatively, the capacitance values of the capacitors 314 and 316 may be reduced to increase the noise floor value of the ΔΣ ADC 300. Because the capacitors 314 and 316 may need to be adjustable in some embodiments, the capacitors 314 and 316 may be variable capacitors. Alternatively, the capacitors 314 and 316 may be switched capacitor elements making up a larger programmable (variable) capacitance device substituted for capacitors 314 and/or 316.

Adjusting the input path from the first configuration to the second configuration may also include adjusting the value of current flowing in the ADC. For example, the current supplied to some devices in the ADC may be increased to reduce the noise floor value of the ADC and increase the SNR. Alternatively, the current supplied to some devices in the ADC may be decreased to increase the noise floor value of the ADC. In some embodiments, a combination of resistors, capacitors, and current may be adjusted to adjust the input path from the first configuration to the second configuration.

Figure 4:
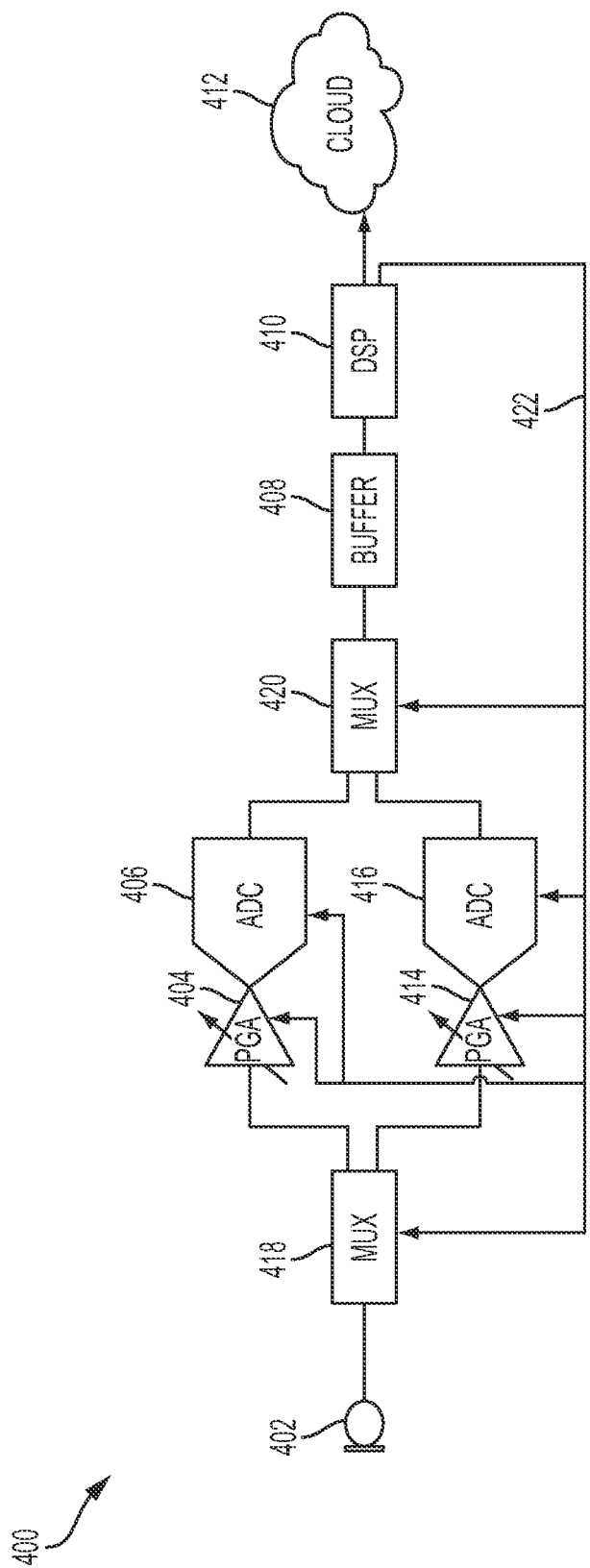
FIG. 4 is an example schematic block diagram illustrating an adjustable dual-path input according to one embodiment of the disclosure.

As described above, two or more input path configurations may be provided by allowing dynamic reconfiguration of the input path. Two or more input path configurations may also be provided by using multiple input paths. FIG. 4 provides an example schematic block diagram illustrating a dual-path input path which may be adjusted according to one embodiment of the disclosure. Similar to electronic system 100 illustrated in FIG. 1, electronic system 400 may include a microphone 402, a programmable gain amplifier (PGA) 404, an ADC 406, a buffer 408, a digital signal processor (DSP) 410, and a computing network 412. The PGA 404 may be an explicit gain stage or a virtual/functional PGA, such as when the PGA 404 is replaced by inherent gain obtained at the ADC 406. The electronic system 400 with the dual-path input also includes an additional PGA 414, an additional ADC 416, a first multiplexer 418, and a second multiplexer 420. In some embodiments, each PGA-ADC pair may be designed and operated to meet a different SNR requirement imposed by the DSP 410. For example, the PGA-ADC pair consisting of PGA 404 and ADC 406 may correspond to a low power, low dynamic range ADC in which PGA 404 may be set to have a low gain. The low gain may be selected to be sufficient for the ADC 406 to output audio samples with sufficient SNR for the DSP 410 to detect a trigger in the audio samples. The PGA-ADC pair consisting of PGA 414 and ADC 416 may correspond to a high power, high dynamic range ADC in which PGA 414 may be set to have a higher gain. The higher gain may be selected to be sufficient for the ADC 416 to perform speech processing routines on the audio samples. In other words, PGA 414 may have higher gain than PGA 404 and/or ADC 416 may have a lower noise floor than ADC 406. In some embodiments, at any given time, only one of the PGA-ADC pairs may be processing the audio samples and outputting audio samples for further processing by the DSP 410. In embodiments in which the input path is a dual-path input path, such as the dual-path input path illustrated in FIG. 4, the DSP may be configured to perform the step of adjusting the input path from the first configuration to the second configuration by de-activating the first ADC of the input path, such as ADC 406, and activating the second ADC of the input path, such as ADC 416. In some embodiments, such as embodiments in which a PGA-ADC pair consists of separate PGA and ADC components, PGA 404 may also be de-activated when ADC 406 is de-activated and PGA 414 may also be activated when ADC 416 is activated. Although two PGAs 404 and 414 are described throughout, one embodiment of FIG. 4 may be realized without explicit PGAs 404 and 414. For example, ADCs 406 and 416 may be configured with different full-scales, which would result in different gains in the two paths without the presence of PGAs 404 and 414.

In some embodiments, de-activation and activation of the components in the dual-path input path illustrated in FIG. 4 may be realized via feedback path 422. In addition, in some embodiments, feedback path 422 may also be used by the DSP 410 to control which paths in the muxes 418 and 420 are closed to allow signal transmission via the paths and which paths are open to restrict signal transmission via the paths. Further, although mux 418 is illustrated in FIG. 4, the feedback path 422 may be implemented without mux 418 by allowing input to drive both inputs. In that configuration, the feedback would be provided to both paths (a first path through ADC 406 and a second path through ADC 416), and the mux 420 would select only one of the paths to continue through the system 400. Although only two PGA-ADC pairs are illustrated in FIG. 4, additional pairs may be implemented and controlled through the feedback path 422.

Figure 5:
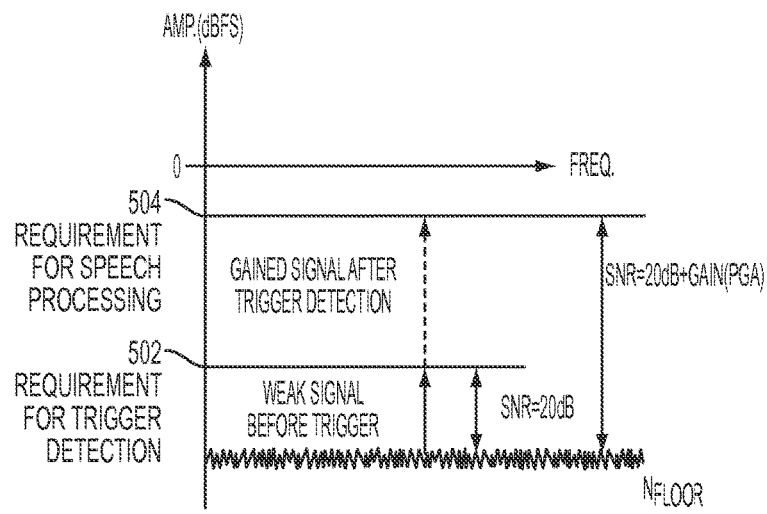
FIG. 5 is an example amplitude-versus-frequency plot illustrating performance improvement achieved by the adjustable input path according to one embodiment of the disclosure.

The adjustment of the input path from the first configuration to the second configuration may increase the performance of the components in the input path such that audio samples output from the input path have sufficient SNR to meet the SNR requirements imposed by the DSP 110 for performing speech processing on the audio samples. For example, FIG. 5 is an example amplitude-versus-frequency plot illustrating performance improvement achieved by adjusting the input path to the second configuration according to one embodiment of the disclosure. When the input path is in the first configuration, the input path may produce audio samples with sufficient SNR reaching level 502 to meet the requirements for trigger detection. For example, in embodiments in which the minimum SNR requirement imposed by the DSP 110 is 20 dB, the input path in the first configuration may output audio samples with an SNR of at least 20 dB. When the input path is in the second configuration, the input path may produce audio samples with sufficient SNR to meet the requirements for speech processing that reach level 504. For example, when adjusting the input path includes adjusting the gain, the increase in gain may be enough of an increase that audio samples output by the input path in the second configuration meet the SNR requirement imposed by the DSP 110 for performing speech processing on the audio samples.

Returning to FIG. 1, the DSP 110 may be further configured to receive a second portion of audio through the input path after the input path has been adjusted to be configured in the second configuration. Audio samples processed by the input path in the second configuration may have sufficient SNR to meet the SNR requirements imposed by the DSP for performing speech processing on the audio samples. The DSP may be further configured to perform speech analysis on the second portion of audio.

In some embodiments, the second configuration of the input path may be the same as the first configuration of the input path. For example, in some embodiments, the SNR of audio samples part of the first portion of audio may be high enough to meet the SNR requirements imposed by the DSP to perform speech processing. If so, the ADC can be maintained in the first configuration to process the second portion of audio, and subsequent portions of audio, because no SNR improvement may be needed.

In some embodiments, the second portion of audio received by the DSP may have amplitudes that yield an SNR that is so high that signal clipping may become an issue or that is too low for the DSP 110 to perform reliable speech processing. For example, in some embodiments, signal characteristics of the audio samples may be determined based on the first portion of audio, and the input path may be adjusted based on the signal characteristics determined from the first portion of audio. The second portion of audio may not have the same signal characteristics as the first portion of audio. Therefore, in some embodiments, the DSP 110 may also detect characteristics of the second portion of audio and adjust the input path based on the signal characteristics determined from the second portion of audio.

In particular, in some embodiments, the DSP 110 may be further configured to adjust a gain of the input path to a third configuration based, at least in part, on the received second portion of audio. For example, the DSP 110 may further adjust the input path to either (1) further increase the signal amplitudes of the audio samples received by the microphone 102 when the audio samples in the second portion of audio do not have sufficient SNR for the DSP to perform speech processing or (2) reduce the signal amplitudes of the audio samples received by the microphone 102 when the audio samples in the second portion of audio have so high an amplitude that clipping may occur. In some embodiments, a signal level may be considered so high that clipping may occur when the signal level exceeds a predetermined threshold. In another embodiment, a signal level may be considered so high that clipping may occur when the signal level is higher than 90% of the maximum signal level that can be processed by the ADC.

After the input path has been adjusted to the third configuration, the DSP 110 may receive a third portion of audio through the input path having the third configuration and perform speech analysis on the third portion of audio. In some embodiments, the DSP 110 may also be configured to continue to adjust the gain of the input path for additional portions of audio. Therefore, in some embodiments, the adjustment of the gain applied in the input path may be a dynamic adjustment that dynamically increases or decreases the gain applied in the input path such that audio samples processed by the DSP have sufficient SNR to perform reliable speech processing but not an SNR so high that clipping occurs.

Figure 6:
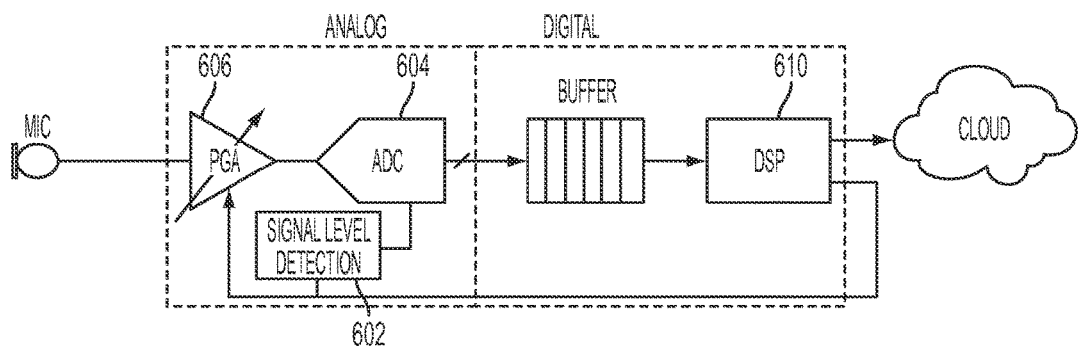
FIG. 6 is an example schematic block diagram illustrating another voice-activated system for reducing the amplitude of the audio signals being processed by the voice-activated system according to one embodiment of the disclosure.

The reconfiguration of the input path may be quick enough such that signals do not get clipped. For example, upon detecting that the signal levels of the audio samples are too high, the DSP 110 may reduce the gain at PGA 104 via the feedback path 118. FIG. 6 illustrates an example schematic block diagram to quickly reduce the amplitude of the audio signals being processed by the voice-activated system, in which a signal level detection circuit 602 is coupled to the ADC 604 and the PGA 606. The signal level detection circuit 602 may detect the signal level of the audio samples being processed by the ADC 604, and if the signal levels reach a predetermined threshold, the signal level detection circuit 602 may reduce the gain applied by the PGA 606. If the amplitude of audio samples received by DSP 610 are too low, then the DSP 610 may increase the gain at PGA 606. The rate at which gain is decreased and the rate at which gain is increased may be asymmetrical. That is, the gain may be decreased quickly to avoid clipping but increased at a slower rate to avoid destabilizing the control loop in the voice-activated system.

The input path may be adjusted to return to the first configuration to monitor and process audio samples for human voice activity and for detection of the trigger. For example, after speech processing of the audio samples has finished and/or if human voice activity is no longer present in the audio samples, the input path can be adjusted to the first configuration to consume less power. In some embodiments, the voice-activated system may be configured to return the input path to the first configuration after a predetermined amount of time has passed since speech processing was performed on audio samples or since human voice activity was last present in the audio samples. For example, the input path may be returned to the first configuration after five or more seconds of time during which no human voice activity is detected.

In view of exemplary systems shown and described herein, methodologies that may be implemented in accordance with the disclosed subject matter will be better appreciated with reference to various functional block diagrams. While, for purposes of simplicity of explanation, methodologies are shown and described as a series of acts/blocks, it is to be understood and appreciated that the claimed subject matter is not limited by the number or order of blocks, as some blocks may occur in different orders and/or at substantially the same time with other blocks from what is depicted and described herein. Moreover, not all illustrated blocks may be required to implement methodologies described herein. It is to be appreciated that functionality associated with blocks may be implemented by software, hardware, a combination thereof or any other suitable means (e.g. device, system, process, or component). Additionally, it should be further appreciated that methodologies disclosed throughout this specification are capable of being stored on an article of manufacture to facilitate transporting and transferring such methodologies to various devices. Those skilled in the art will understand and appreciate that a methodology could alternatively be represented as a series of interrelated states or events, such as in a state diagram.

Figure 7:
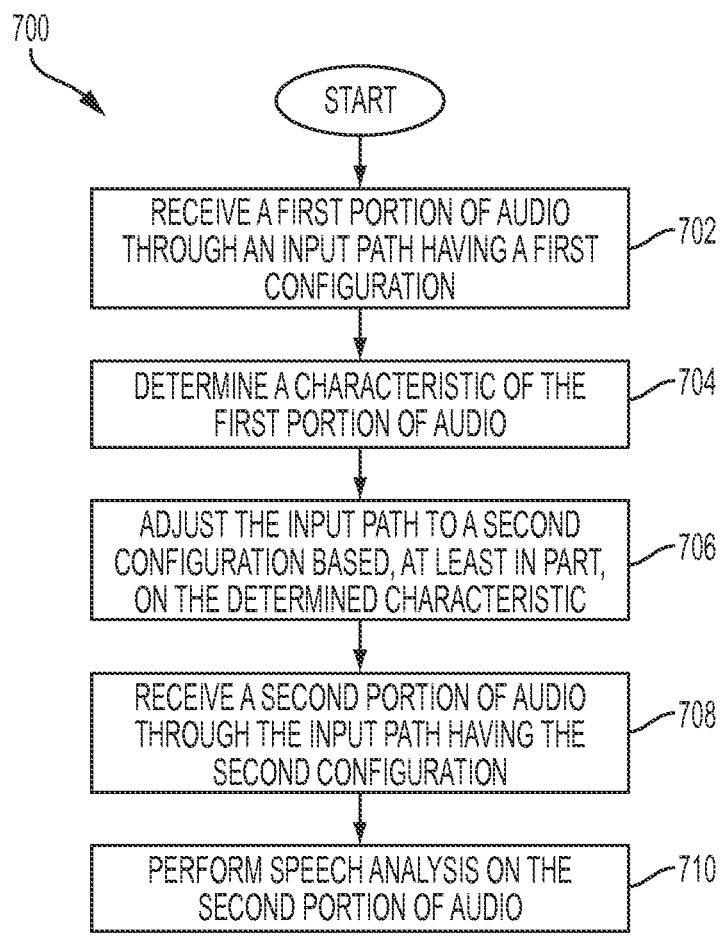
FIG. 7 is an example flow chart illustrating a method for low power DR enhancement of voice-activated systems according to one embodiment of the disclosure.

FIG. 7 is an example flow chart illustrating a method for low power DR enhancement of voice-activated systems according to one embodiment of the disclosure. Method 700 may be implemented with the systems described with respect to FIGS. 1-6. Method 700 begins at block 702 with receiving a first portion of audio through an input path having a first configuration. In some embodiments, the first portion of audio may include a trigger command. At block 704, method 700 includes determining a characteristic of the first portion of audio, which in some embodiments may include at least one of a SNR, a signal level, and a frequency content.

Method 700 includes, at block 706, adjusting the input path to a second configuration based, at least in part, on the determined characteristic. In some embodiments, adjusting the input path may include adjusting at least one of a gain, a SNR, and a dynamic range of the input path. For example, according to one embodiment, adjusting the input path may include adjusting a gain for an amplifier of the input path from a first value of the first configuration to a higher second value of the second configuration. In some embodiments, adjusting the gain may include adjusting the gain based, at least in part, on a signal level of the first portion of audio to obtain a desired SNR in the input path for performing speech analysis on a second portion of audio that may include an instruction command. In other embodiments, adjusting the input path, such as at block 706, may include adjusting a noise floor for an ADC of the input path from a first value part of the first configuration to a lower second value part of the second configuration. For example, according to one embodiment, adjusting the noise floor may include at least one of: adjusting a value of a resistor in the ADC, adjusting a value of a capacitor in the ADC, and adjusting a value of current flowing in the ADC.

According to another embodiment, the input path may be a dual-path input path that includes a different ADC in each of two paths, where each ADC can be designed according to different performance constraints and specifications. In such embodiments, adjusting the input path, such as at block 706, may also include de-activating a first ADC of the input path and activating a second ADC of the input path. In some embodiments, the first ADC may be a low-power, low DR ADC with minimal signal amplification in its gain stage, and the second ADC may be a high-power, high DR ADC with more signal amplification in its gain stage than the first ADC. Although power is referenced for the first and second ADC, the first and second ADC may have similar amplification capabilities. A low-power first ADC, as compared with a higher-power second ADC, may be obtained by decreasing dynamic range.

Next, method 700 includes at block 708 receiving a second portion of audio through the input path having the second configuration. For example, the second portion of audio may be the portion of audio that includes an instruction command spoken by a human voice. At block 710, method 700 includes performing speech analysis on the second portion of audio. For example, speech analysis may be performed with a DSP, such as DSP 110 illustrated in FIG. 1.

In some embodiments, the signal level of audio samples in the second portion of audio may be different than the signal level of audio samples in the first portion of audio. The gain of the input path may be adjusted to a third configuration based, at least in part, on a characteristic of the received second portion of audio. Subsequently, a third portion of audio may be received through the input path having the third configuration, and speech analysis may be performed on the third portion of audio. According to an embodiment, a system employing method 700 may continue to adjust the gain of the input path for additional portions of audio.

The schematic flow chart diagram of FIG. 7 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
    receiving a first portion of audio comprising a trigger command through an input path of a voice-activated system having a first configuration;
    determining a characteristic of the first portion of audio, wherein the characteristic is indicative of a quality of the first portion of audio;
    determining whether the trigger command is detected in the first portion of audio and whether the quality of audio samples in the first portion of audio is sufficient for speech analysis of subsequent audio samples from the input path based, at least in part, on the determined characteristic of the first portion of audio;
    when the trigger command is detected and the quality is insufficient, adjusting the input path to a second configuration based, at least in part, on the determined characteristic of the first portion of audio to improve performance of the input path for speech processing of an instruction command, wherein adjusting the input path comprises reconfiguring hardware in the input path;
    receiving a second portion of audio comprising the instruction command through the input path having the second configuration; and
    performing speech analysis on the second portion of audio.

2. The method of claim 1, wherein the step of adjusting the input path to a second configuration comprises increasing a dynamic range (DR) of the input path.

3. The method of claim 1, wherein the step of determining the characteristic comprises determining at least one of a signal-to-noise ratio (SNR), a signal level, and a frequency content.

4. The method of claim 1, wherein the step of adjusting the input path comprises adjusting at least one of a gain, a signal-to-noise ratio (SNR), and a dynamic range of the input path.

5. The method of claim 1, wherein the step of adjusting the input path comprises:
    de-activating a first analog-to-digital converter (ADC) of the input path; and
    activating a second analog-to-digital converter (ADC) of the input path.

6. The method of claim 5, wherein the first ADC comprises a low-power, low dynamic range ADC, and wherein the second ADC comprises a high-power, high dynamic range ADC.

7. The method of claim 1, wherein the step of adjusting the input path comprises adjusting a gain for an amplifier of the input path from a first value of the first configuration to a higher second value of the second configuration.

8. The method of claim 7, wherein the step of adjusting the gain comprises adjusting the gain based, at least in part, on a signal level of the first portion of audio to obtain a desired signal-to-noise ratio (SNR) in the input path for performing speech analysis on the second portion of audio.

9. The method of claim 7, further comprising:
    adjusting a gain of the input path to a third configuration based, at least in part, on a characteristic of the received second portion of audio;
    receiving a third portion of audio through the input path having the third configuration;
    performing speech analysis on the third portion of audio; and
    continuing to adjust the gain of the input path for additional portions of audio.

10. The method of claim 1, wherein the step of adjusting the input path comprises adjusting a noise floor for an analog-to-digital converter (ADC) of the input path from a first value for the first configuration to a lower second value for the second configuration.

11. The method of claim 10, wherein the step of adjusting the noise floor comprises at least one of:
    adjusting a value of a resistor in the analog-to-digital converter (ADC);
    adjusting a value of a capacitor in the analog-to-digital converter (ADC); and
    adjusting a value of current flowing in the analog-to-digital converter (ADC).

12. The method of claim 1, wherein the step of performing speech analysis comprises performing speech analysis with a digital signal processor (DSP).

13. An apparatus, comprising:
    a microphone;

an input path coupled to receive audio signals from the microphone, the input path comprising:
an analog-to-digital converter (ADC); and
a digital signal processor (DSP) configured to receive a digital representation of the audio signals from the analog-to-digital converter (ADC), wherein the DSP is configured to:
receive a first portion of audio comprising a trigger command through the input path having a first configuration;
determine a characteristic of the first portion of audio, wherein the characteristic is indicative of a quality of the first portion of audio;
determine whether the trigger command is detected in the first portion of audio and whether the quality of audio samples in the first portion of audio is sufficient for speech analysis of subsequent audio samples from the input path based, at least in part, on the determined characteristic of the first portion of audio;
when the trigger command is detected and the quality is insufficient, adjust the input path to a second configuration based, at least in part, on the determined characteristic of the first portion of audio to improve performance of the input path for speech processing of an instruction command, wherein adjusting the input path comprises reconfiguring hardware in the input path; and
receive a second portion of audio comprising the instruction command through the input path having the second configuration.

14. The apparatus of claim 13, wherein the digital signal processor (DSP) is configured to adjust the input path to a second configuration by increasing a dynamic range (DR) of the input path.

15. The apparatus of claim 13, wherein the input path further comprises a second analog-to-digital converter (ADC), and wherein the DSP is configured to perform the step of adjusting the input path by:
de-activating a first analog-to-digital converter (ADC) of the input path; and
activating a second analog-to-digital converter (ADC) of the input path.

16. The apparatus of claim 15, wherein the first ADC comprises a low-power, low dynamic range ADC, and wherein the second ADC comprises a high-power, high dynamic range ADC.

17. The apparatus of claim 13, wherein the input path further comprises an amplifier coupled between the microphone and the analog-to-digital converter (ADC), and wherein the step of adjusting the input path comprises adjusting a gain for an amplifier of the input path from a first value of the first configuration to a higher second value of the second configuration.

18. The apparatus of claim 17, wherein the step of adjusting the gain comprises adjusting the gain based, at least in part, on a signal level of the first portion of audio to obtain a desired signal-to-noise ratio (SNR) in the input path for performing speech analysis on the second portion of audio.

19. The apparatus of claim 17, wherein the DSP is further configured to:
adjust a gain of the input path to a third configuration based, at least in part, on the received second portion of audio;
receive a third portion of audio through the input path having the third configuration;
perform speech analysis on the third portion of audio; and
continue to adjust the gain of the input path for additional portions of audio.

20. The apparatus of claim 13, wherein the step of adjusting the input path comprises adjusting a noise floor of the analog-to-digital converter (ADC) of the input path from a first value for the first configuration to a lower second value for the second configuration.

21. The apparatus of claim 20, wherein the step of adjusting the noise floor comprises at least one of:
adjusting a value of a resistor in the analog-to-digital converter (ADC);
adjusting a value of a capacitor in the analog-to-digital converter (ADC); and
adjusting a value of current flowing in the analog-to-digital converter (ADC).

22. The apparatus of claim 13, wherein the DSP is further configured to perform the step of performing speech analysis on the second portion of audio.

23. A mobile device, comprising:
a microphone;
audio processing circuitry coupled to the microphone and configured to receive audio signals comprising voice commands from the microphone, the audio processing circuitry comprising:
an analog-to-digital converter (ADC); and
a digital signal processor (DSP) coupled to the ADC to receive a digital representation of the audio signals, wherein the audio processing circuitry is configured to:
receive a first portion of audio comprising a trigger command from the microphone while the audio processing circuitry is configured in a first configuration;
determine a characteristic of the first portion of audio, wherein the characteristic is indicative of a quality of the first portion of audio;
determine whether the trigger command is detected in the first portion of audio and whether the quality of audio samples in the first portion of audio is sufficient for speech analysis of subsequent audio samples from the input path based, at least in part, on the determined characteristic of the first portion of audio;
when the trigger command is detected and the quality is insufficient, adjust the audio processing circuitry to a second configuration based, at least in part, on the determined characteristic of the first portion of audio to improve performance of the audio processing circuitry for speech processing of an instruction command, wherein adjusting comprises reconfiguring hardware of the audio processing circuitry; and
receive a second portion of audio comprising the instruction command from the microphone while the audio processing circuitry is configured in the second configuration.

24. The mobile device of claim 23, wherein the audio processing circuitry is configured to adjust the audio processing circuitry to a second configuration by increasing a dynamic range (DR) of the audio processing circuitry.

25. The mobile device of claim 23, wherein the audio processing circuitry further comprises a second analog-to-digital converter (ADC), and wherein the adjusting comprises:
de-activating the analog-to-digital converter (ADC); and
activating a second analog-to-digital converter (ADC).

26. The mobile device of claim 25, wherein the ADC comprises a low-power, low dynamic range ADC, and wherein the second ADC comprises a high-power, high dynamic range ADC.

27. The mobile device of claim 23, wherein the audio processing circuitry further comprises an amplifier coupled between the microphone and the analog-to-digital converter (ADC), and wherein the step of adjusting comprises adjusting a gain for an amplifier from a first value of the first configuration to a higher second value of the second configuration.

28. The mobile device of claim 27, wherein the step of adjusting the gain comprises adjusting the gain based, at least in part, on a signal level of the first portion of audio to obtain a desired signal-to-noise ratio (SNR) for performing speech analysis on the second portion of audio.

29. The mobile device of claim 28, wherein the audio processing circuitry is further configured to perform the steps of:
adjusting the gain of the amplifier to a third configuration based, at least in part, on the received second portion of audio;
receiving a third portion of audio while the gain is set to the third configuration;
performing speech analysis on the third portion of audio; and
continuing to adjust the gain of the amplifier for additional portions of audio.

30. The mobile device of claim 23, wherein the step of adjusting comprises adjusting a noise floor for the analog-to-digital converter (ADC) of the input path from a first value for the first configuration to a lower second value for the second configuration.

31. The mobile device of claim 30, wherein the audio processing circuitry comprises at least one of a variable resistor and a variable capacitor, and wherein the audio processing circuitry is configured to adjust the noise floor by performing at least one of the steps of:
adjusting a value of a resistor in the analog-to-digital converter (ADC);
adjusting a value of a capacitor in the analog-to-digital converter (ADC); and
adjusting a value of current flowing in the analog-to-digital converter (ADC).

32. The mobile device of claim 23, wherein the audio processing circuitry is further configured to perform the step of performing speech analysis on the second portion of audio.

33. The mobile device of claim 23, wherein the digital signal processor (DSP) comprises a portion of a general purpose central processing unit (CPU) of the mobile device.

* * * * *